(12) United States Patent
Orlowski

(10) Patent No.: US 7,202,117 B2
(45) Date of Patent: Apr. 10, 2007

(54) METHOD OF MAKING A PLANAR DOUBLE-GATED TRANSISTOR

(75) Inventor: Marius K. Orlowski, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 252 days.

(21) Appl. No.: 11/047,448

(22) Filed: Jan. 31, 2005

(65) Prior Publication Data

US 2006/0172468 A1 Aug. 3, 2006

(51) Int. Cl.
*H01L 21/00* (2006.01)
*H01L 21/84* (2006.01)

(52) U.S. Cl. .......................... 438/149; 257/57

(58) Field of Classification Search .............. 438/142, 438/149, 153, 154, 157, 164, 176, 195, 201, 438/211, 257, 270, 283
See application file for complete search history.

(56) References Cited

U.S. PATENT DOCUMENTS

| | | | |
|---|---|---|---|
| 5,258,635 A | 11/1993 | Nitayama | |
| 5,773,331 A | 6/1998 | Solomon | |
| 6,339,002 B1 | 1/2002 | Chan | |
| 6,495,403 B1 | 12/2002 | Skotnicki | |
| 6,580,132 B1 | 6/2003 | Chan | |
| 6,605,847 B2 | 8/2003 | Kim | |
| 6,642,115 B1 * | 11/2003 | Cohen et al. | ............... 438/283 |
| 2004/0063298 A1 | 4/2004 | Aga | |
| 2004/0063329 A1 | 4/2004 | Yanagisawa | |

OTHER PUBLICATIONS

Dao, "Advanced Double-Gate Fully-Depleted Silicon-on-Insulator (DG-FDSOI) Device and Device Impact on Circuit Design & Power Management," 2004 International Conference on Integrated Circuit Design and Technology, IEEE Central Texas Section & Japan Society of Applied Physics, May 2004, pp. 99-103.

(Continued)

*Primary Examiner*—Akm Ullah
*Assistant Examiner*—Jenny L. Wagner
(74) *Attorney, Agent, or Firm*—James L. Clingan, Jr.; Michael Balconi-Lamica

(57) ABSTRACT

A silicon layer interposed between the top silicon nitride layer (SiN) and a silicon germanium layer (SiGe) which in turn is over a thick oxide (BOX) is selectively etched to leave a stack with a width that sets the gate length. A sidewall insulating layer is formed on the SiGe layer leaving the sidewall of the Si layer exposed. Silicon is epitaxially grown from the exposed silicon sidewall to form in-situ-doped silicon source/drain regions. The nitride layer is removed using the source/drain regions as a boundary for an upper gate location. The source/drain regions are coated with a dielectric. The SiGe layer is removed to provide a lower gate location. Both the upper and lower gate locations are filled with metal to form upper and lower gates for the transistor.

20 Claims, 7 Drawing Sheets

OTHER PUBLICATIONS

Wong et al., "Device Design Considerations for Double-Gate, Ground-Plane, and Single-Gated Ultra-Thin SOI MOSFET's at the 25 nm Channel Length Generation," IEEE, 1998, pp. 15.2.1-15.2.4.

Maleville et al., "Multiple SOI Layers by Multiple Smart-Cut Transfers," IEEE, 2000, pp. 134-135.

"Two Gates are Better Than One, A Planar Self-Aligned Double-Gate MOSFET Technology to Achieve the Best On/Off Switching Ratios as Gate Lengths Shrink," IEEE Circuits & Devices Magazine, Jan. 2003, pp. 48-62.

Shenoy et al., "Novel Process for Fully Self-aligned Planar Ultrathin Body Double-Gate FET," 2004 IEEE International SOI Conference, pp. 190-191.

Ogura, "Highly Uniform SOI Fabrication by Applying Voltage During KOH Etching of Bonded Wafers," Proceedings 1995 IEEE International SOI Conference, pp. 58-59.

Prior Art Reference 10/871,402.

Prior Art Reference 10/971,657.

* cited by examiner

METHOD OF MAKING A PLANAR DOUBLE-GATED TRANSISTOR

FIELD OF THE INVENTION

The present invention relates to semiconductor devices, and more particularly, to a method of making a planar double-gated transistor.

RELATED ART

As transistors continue to get smaller and smaller maintaining the current drive while still being able to turn the transistor off has become a bigger challenge. If the current drive is maintained, the leakage is too high. One of the techniques to improve this has been fully depleted devices. This has been further enhanced by double-gated devices. Double-gated transistors provide both a more effective current drive and low leakage. This has been most easily conceived in a FinFET arrangement where the gates are disposed on the sides of a fin of silicon. FinFET-based circuit design requires a whole a new design technology and FinFETs suffer from line edge roughness at the (110)/(100) interface and is difficult for use in analog applications because of its quantized width increments. Planar double-gated devices do not suffer from these problems but do present other manufacturing difficulties due to one of the gates being below the channel. The solutions tend present manufacturing challenges relating to the beginning stack of materials, gate contact, source/drain contact, and forming the lower gate.

Thus, there is a need for a method that alleviates and/or reduces one or more of these problems.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

SUMMARY OF THE INVENTION

In one aspect, a planar double-gated transistor is achieved with a starting combination of a silicon layer over a silicon germanium layer (SiGe) which in turn is over a thick buried oxide (BOX). An optional oxide layer is grown over the silicon layer and a silicon nitride layer is provided over the stack. The silicon on SiGe on BOX is a combination of layers that is commercially available and the oxide and nitride layers are formed by standard semiconductor processing steps. The combination is etched to leave a stack with a width that is a little greater than a desired gate length of the transistor structure to be completed. A sidewall insulating layer is formed on the SiGe while exposing the sidewall of the silicon. This can be achieved either by oxide growth and partial etch back on the SiGe and full etch back on the silicon sidewall or by a sidewall spacer process that exposes the silicon sidewall while covering the SiGe sidewall. Silicon is epitaxially grown from the exposed silicon sidewall to form in-situ-doped silicon source/drain regions. These are made relatively large to be adjoining the sidewall of the nitride layer. The nitride layer is removed selectively leaving the epitaxially grown source/drain regions as a boundary for a cavity above the silicon layer. Non-conductive material is formed on the sidewalls of the cavity either by oxide growth or a sidewall spacer process. The lower SiGe layer is removed to leave a cavity under the silicon layer. The cavities above and below the silicon layer, after gate dielectric formation on both sides of the silicon layer, are both filled with metal to achieve the double-gated transistor. The metal formation automatically forms extensions from both above and below the silicon layer that grow together and are continuous with metal that is deposited on the BOX. Thus convenient gate contact points outside the stack are available. This is better understood with reference to the drawings and the following description.

DETAILED DESCRIPTION OF THE INVENTION

Figure 1:
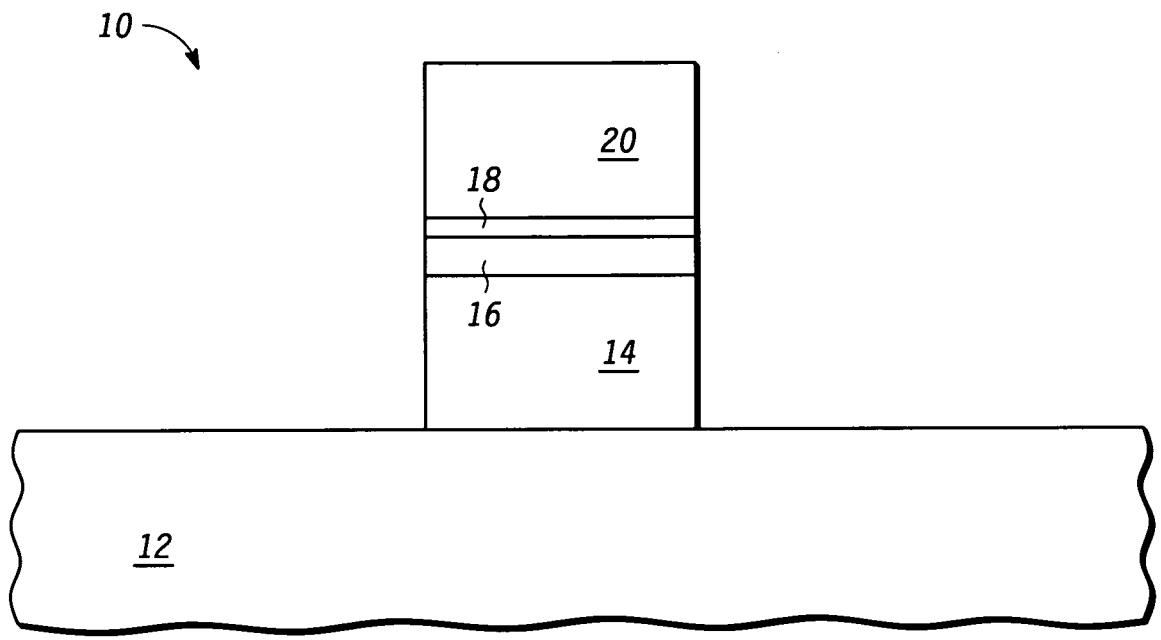
FIG. 1 is a cross section along a first plane of a device structure at a stage in processing according to an embodiment of the invention.

Shown in FIG. 1 is a semiconductor device 10 comprising a thick oxide layer 12 that can be conveniently be referenced as BOX 12, a silicon germanium (SiGe) layer 14 on box 12, a silicon layer 16 on SiGe layer 14, an oxide layer 18 on silicon layer 16, and silicon nitride layer 20 on oxide layer 18. It is understood that in practice there would be a supporting structure under BOX 12 such as a thick silicon layer functioning as a substrate. In this example, BOX 12 is about 1000 Angstroms, SiGe layer 14 is preferably about 30% silicon and about 500 Angstroms, silicon layer 16 is monocrystalline and about 200 Angstroms, oxide layer 18 is about 100 Angstroms, and nitride layer 20 is about 600 Angstroms. These dimensions are exemplary and can vary greatly. As shown in FIG. 1, SiGe layer 14, silicon layer 16, oxide layer 18, and nitride layer 20 have been etched to form a stack having sidewalls useful in forming a double-gated transistor so this stack can thus also be called a pre-transistor stack. The stack as shown has a width of about 500 Angstroms, which will be approximately the channel length of a transistor to be formed in the stack.

Figure 2:
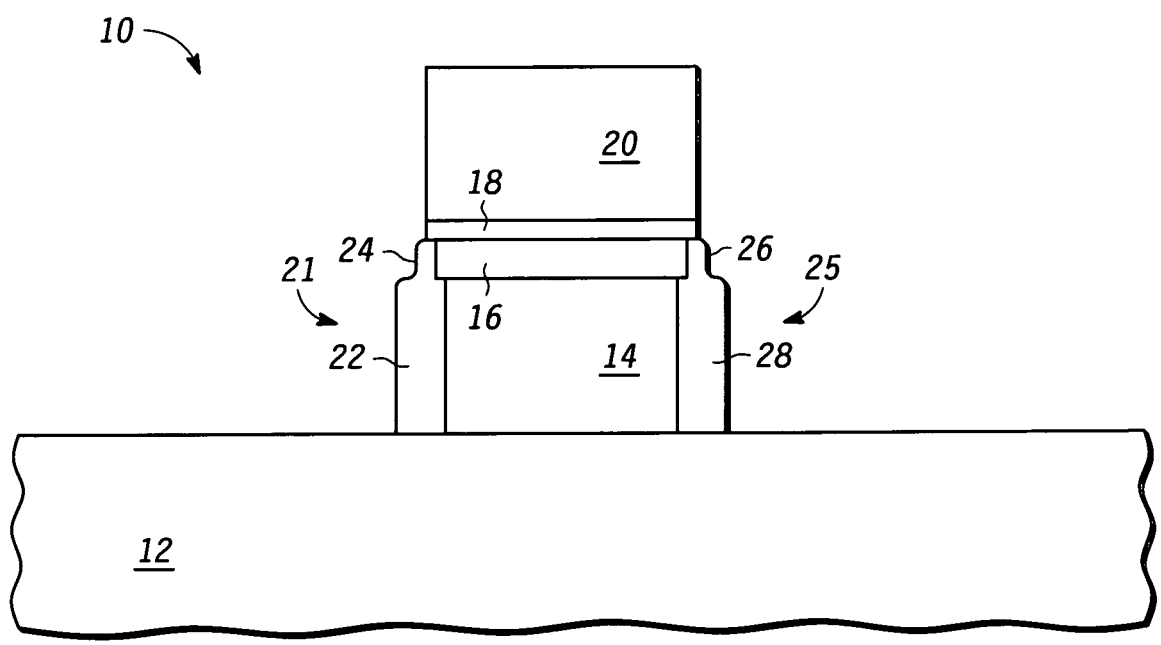
FIG. 2 is a cross section along the first plane of the device structure of FIG. 1 at a subsequent stage in processing.

Shown in FIG. 2 is semiconductor device 10 after growing oxide layers 21 and 25 on exposed sidewalls of SiGe layer 14 and silicon layer 16. Oxide growth is faster on SiGe layer 22 than on silicon layer 16 so that oxide layer 21 has a SiGe sidewall insulator 22 that is thicker, by about four times, than a silicon sidewall insulator 24. Similarly, oxide layer 25 has a SiGe sidewall insulator 28 that is thicker, by about four times, than a silicon sidewall insulator 26. The thickness of SiGe sidewall insulators 22 and 28 is about 250 Angstroms. Because this is a grown oxide process, portions of SiGe layer 14 and silicon layer 16 are consumed in the formation of oxide layers 21 and 25.

Figure 3:
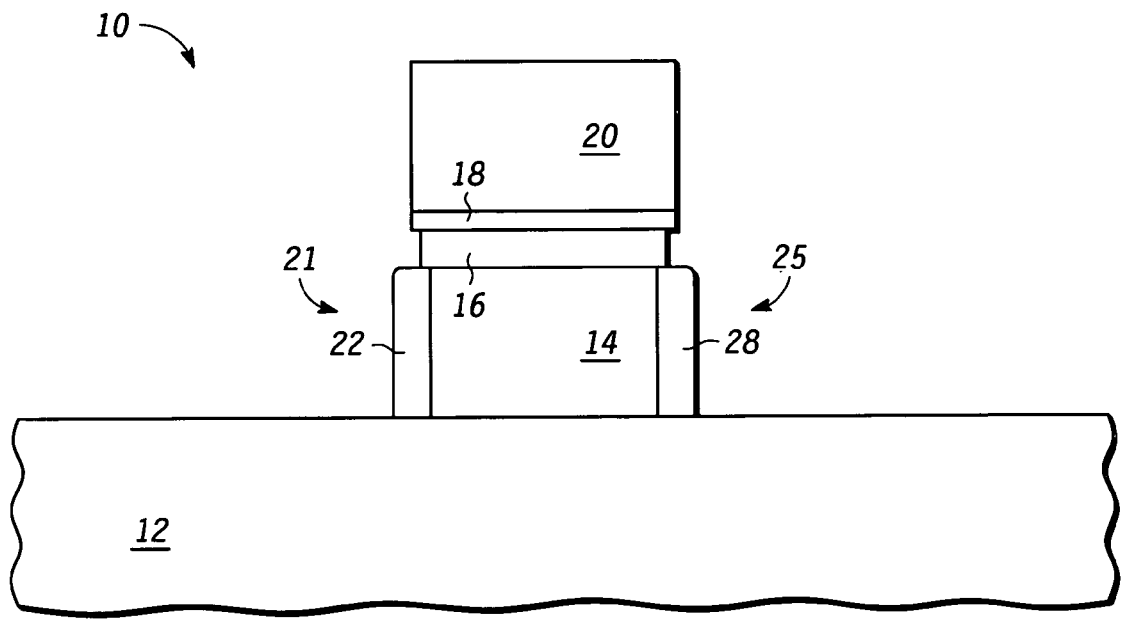
FIG. 3 is a cross section along the first plane of the device structure of FIG. 2 at a subsequent stage in processing.

Shown in FIG. 3 is semiconductor device 10 after an isotropic etch back of oxide layers 21 and 25. This etch is performed sufficiently long to ensure that silicon sidewall insulators 24 and 26 are completely removed to expose the sidewalls of silicon layer 16, but sufficiently short to ensure that SiGe sidewall insulators 22 and 28 are not removed and still cover the sidewalls of SiGe layer 14. In this example, the remaining thickness of SiGe layer is preferably about 150 Angstroms. An alternative is to combine the growth and etch back approach shown in FIGS. 2 and 3 with a sidewall spacer process to form sidewall spacers that result in a sidewall insulator that exposes silicon layer 16, or at least most of it, and covers the sidewalls of the SiGe layer 14. This would result in BOX 12 being exposed to the etchant for the same amount of time that was required to etch the sidewall spacer from the top of the stack to its final position. In such case of using a sidewall spacer, the oxide growth would be significantly less.

Figure 4:
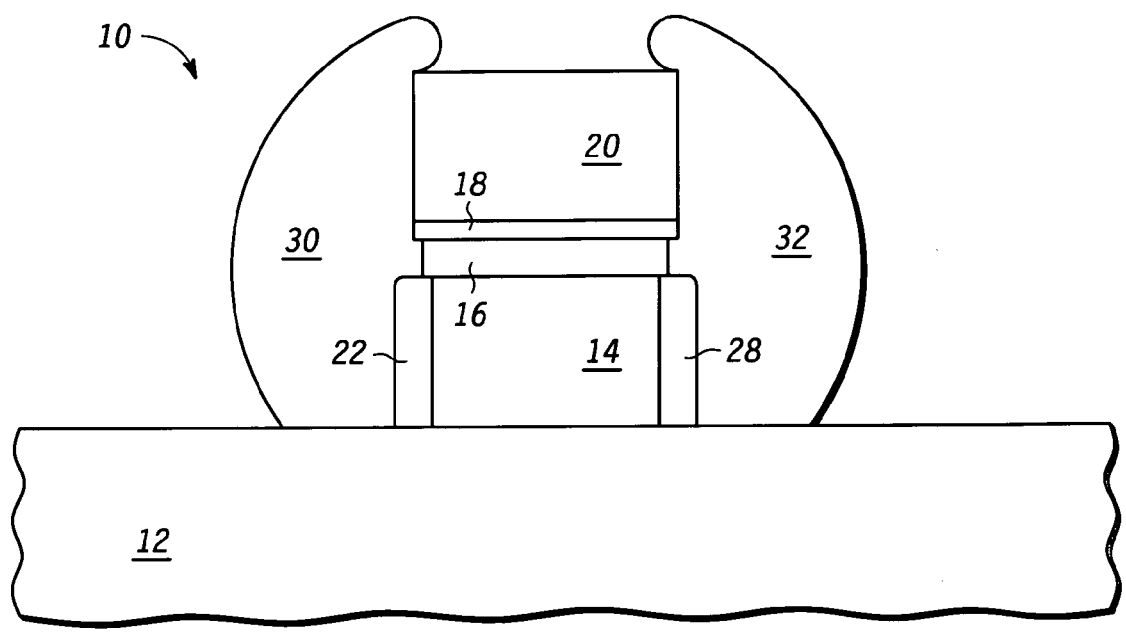
FIG. 4 is a cross section along the first plane of the device structure of FIG. 3 at a subsequent stage in processing.

Shown in FIG. 4 is semiconductor device 10 after epitaxially growing source/drain regions 30 and 32 from the sidewalls of silicon layer 16. This growth continues until source/drain regions completely cover the sidewalls of nitride layer 20. To ensure this, epitaxial growth continues until source/drain layers 30 and 32 extend above nitride layer 20. The epitaxial growth has substantially the same rate in all directions so source drain regions extend laterally outward a little further than the thickness of the combination of oxide layer 18 and nitride layer 20. The lateral extent of the source/drain epitaxial region is about 700 Angstroms, which is sufficient for making a contact to it. The actual lateral dimension from the stack is even greater due to the extra growth above the top surface of nitride layer 20. The desired doping level is achieved by the in situ doping during the epitaxial growth process.

Figure 5:
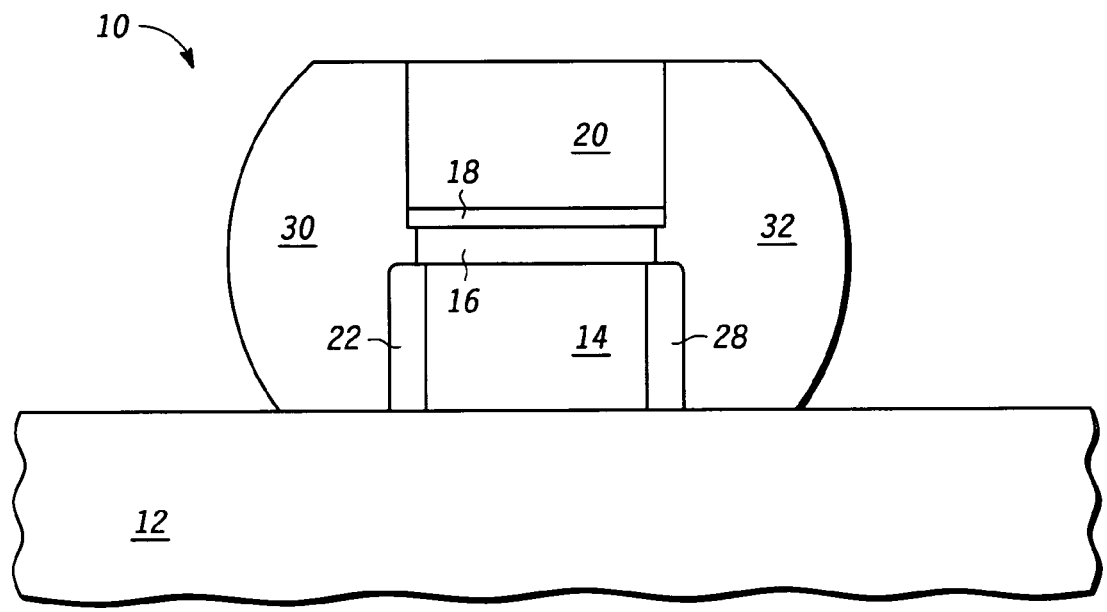
FIG. 5 is a cross section along the first plane of the structure of FIG. 4 at a subsequent stage in processing.

Shown in FIG. 5 is semiconductor device 10 after a chemical mechanical process step which removes the portion of source/drain regions 30 and 32 above nitride layer 20 to achieve a planar surface for nitride layer 20 and source/drain regions 30 and 32.

Figure 6:
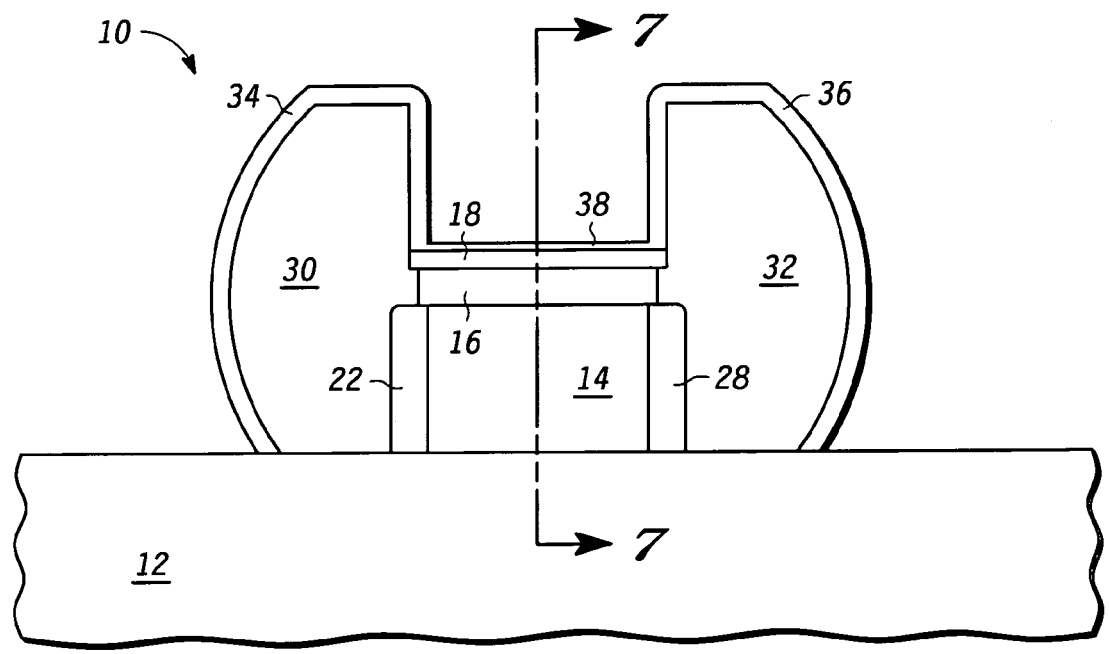
FIG. 6 is a cross section along the first plane of the device structure of FIG. 5 at a subsequent stage in processing.

Shown in FIG. 6 is semiconductor device 10 after removing nitride layer 20 and growing oxide layer 34 on source/drain region 30, oxide layer 36 on source/drain region 32, and oxide layer 38 on the top surface of oxide layer 18. Oxide layers 34 and 36 are preferably about 100 Angstroms and oxide layer 38 is much thinner due to being grown over oxide layer 18 which is disposed over silicon layer 16 which is either undoped or lightly doped compared to source/drain regions 30 and 32. The region where the nitride is removed is one of the gate locations; the upper one. Thus removing nitride layer 20 has the effect of exposing the upper gate location. The other gate location is under silicon layer and can be considered the lower gate location.

As an option optional step which can be in addition to or in place of that described for FIG. 6 is using a sidewall spacer process to form a sidewall spacer inside the opening for the upper gate location. In the case of the sidewall spacer being added to the grown oxide layer described for FIG. 6, the purpose of the sidewall spacer is to provide a dielectric element between source/drain regions 30 and 32 and the upper portion of the gate. This increases the amount of dielectric between the upper gate and source/drain regions 30 and 32.

Figure 7:
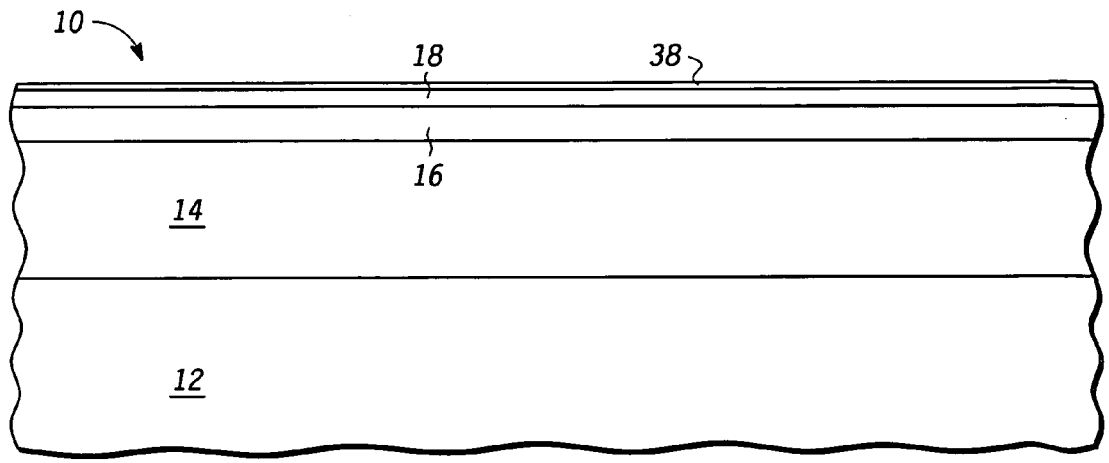
FIG. 7 is a cross section along a second plane of the device structure of FIG. 6.

Shown in FIG. 7 is a cross section taken at 7—7 of FIG. 6. This cross section of FIG. 7 can be considered the second cross sectional plane with the first cross sectional plane being the one used for FIGS. 1–6 through semiconductor 10 as shown in FIG. 6. This FIG. 7 shows that the stack made up of SiGe layer 14, silicon layer 16, oxide layer 18, and oxide layer 38 continues indefinitely across a semiconductor wafer. Although not shown in this FIG. 7, source/drain regions 30 and 32 traverse the same distance as the stack.

Figure 8:
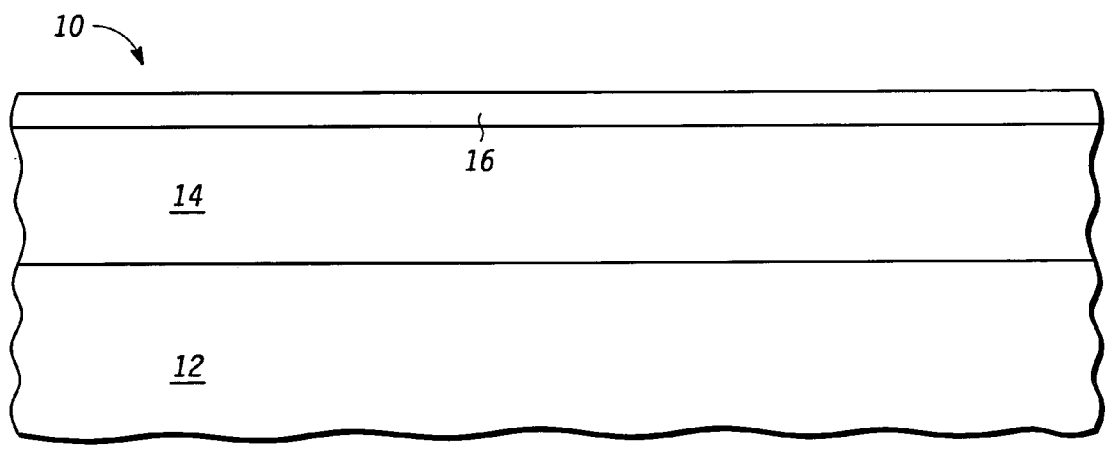
FIG. 8 is cross section along the second plane of the device structure of FIG. 7 at a subsequent state in processing.

Shown in FIG. 8, continuing with the second cross sectional plane, is semiconductor device 10 after removing oxide layers 38 and then 18.

Figure 9:
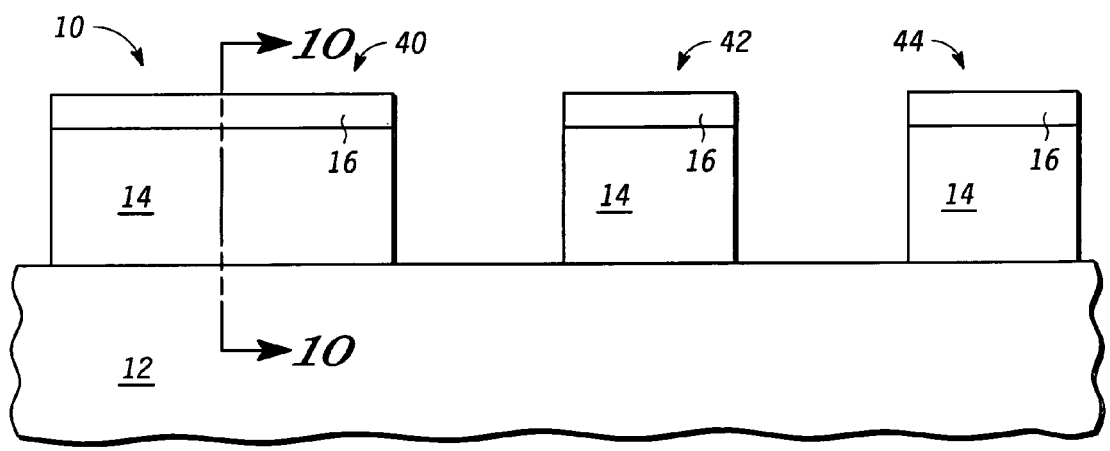
FIG. 9 is a cross section along the second plane of the device structure of FIG. 8 at a subsequent stage in process.

Shown in FIG. 9, continuing with the second cross sectional plane, is semiconductor device 10 after etching through the stack to BOX 12 in selected locations to achieve a plurality of transistors sites; in this example, transistor sites 40, 42, and 44. Each of transistor sites 40, 42, and 44 has a selected width as shown in FIG. 9. The width of these sites in this FIG. 9, corresponds to the channel width of the transistor that will be formed at that site.

Figure 10:
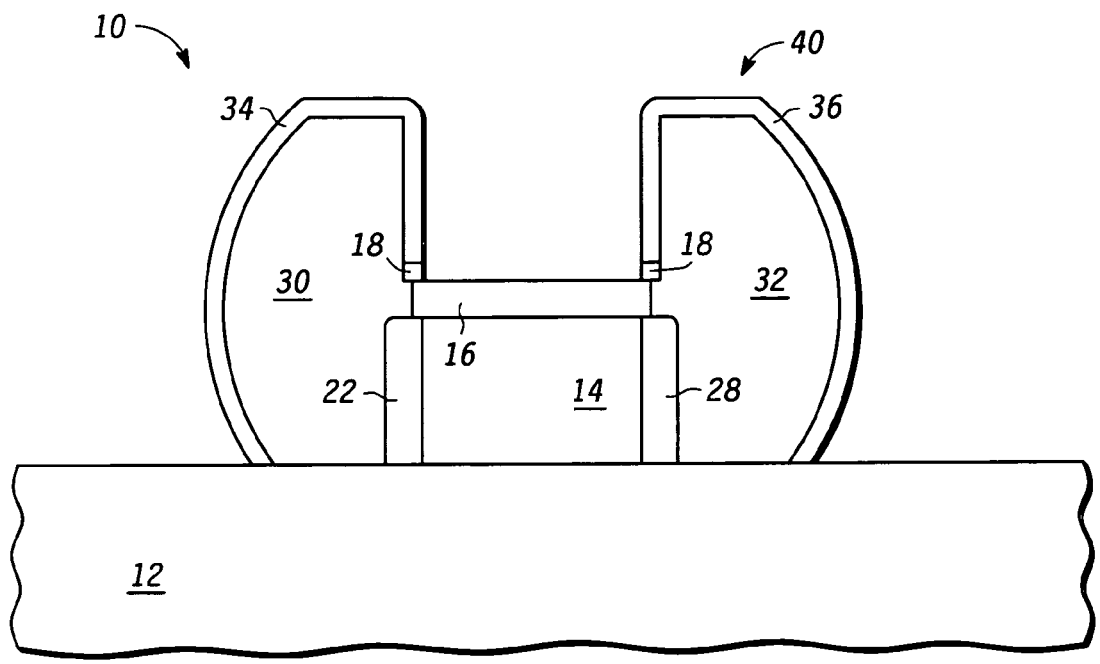
FIG. 10 is a cross section along the first plane of the device structure of FIG. 9.

Shown in FIG. 10 is a cross section taken at 10—10 of FIG. 9, which is a return to the first cross sectional plane, through semiconductor 10 as shown in FIG. 9. The particular cross section is of transistor site 40 but would be the same for transistor sites 42 and 44 as well. This shows that all that remains of oxide layer 18 are small portions adjacent to source/drain layers 30 and 32 and are useful in ensuring continuity of insulation along the sidewalls of source/drain regions 30 and 32, especially in the area over silicon layer 16.

Figure 11:
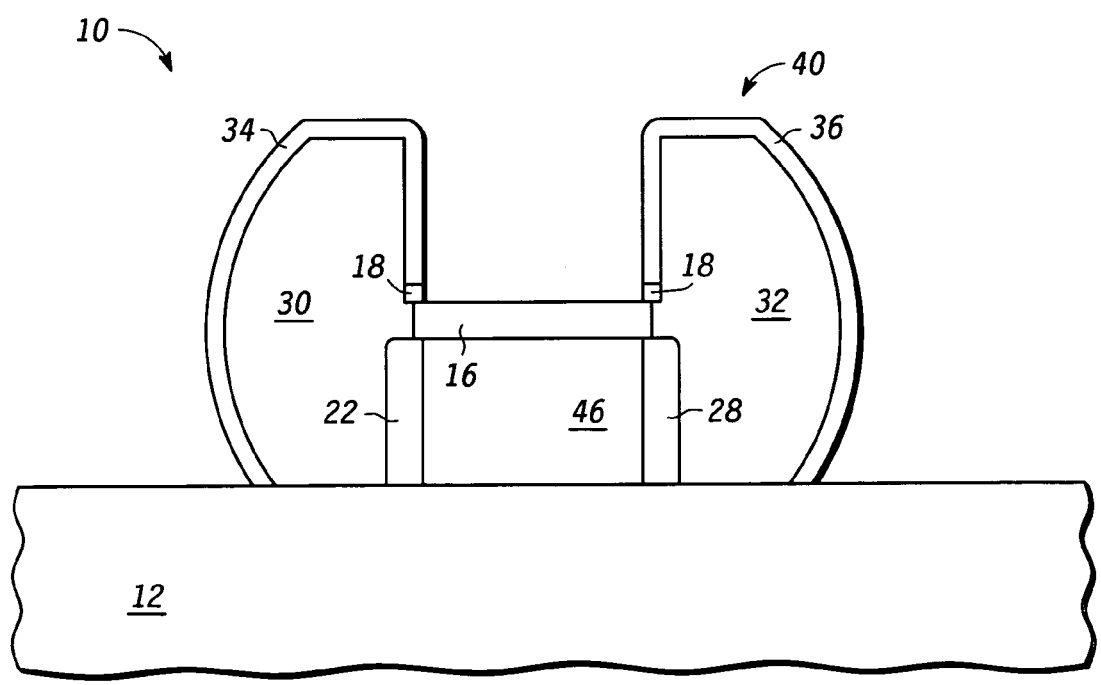
FIG. 11 is a cross section along the first plane of the structure of FIG. 10 at a subsequent stage in processing.

Shown in FIG. 11, continuing now with the first cross sectional plane, is semiconductor device 10 after removal of SiGe layer 14 so that there is a cavity 46 under silicon layer 16. Etch chemistry is known that achieves a greater than 50 to 1 selectivity between SiGe and silicon. Cavity 46 may also be called an opening. The etch that results in this opening has the effect of exposing the lower gate location.

Figure 12:
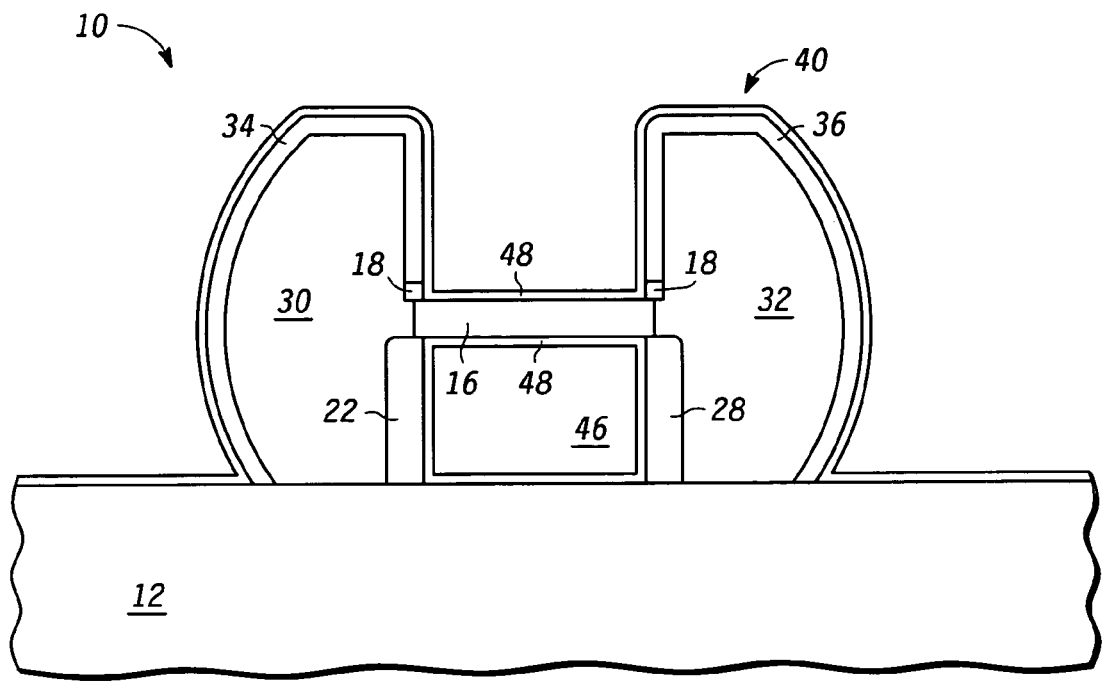
FIG. 12 is a cross section along the first plane of the structure of FIG. 11 at a subsequent stage in processing.

Shown in FIG. 12, continuing with the first cross sectional plane, is a semiconductor device 10 after formation of gate dielectric 48, preferably a high k dielectric such as a metal oxide, hafnium oxide for example, deposited by atomic layer deposition (ALD). Using ALD will result in a substantially uniform thickness being formed on all surfaces. At this point, all of the surfaces are desirably insulators so this does not present a problem. The purpose is to form a gate dielectric so the material is chosen for that purpose.

Figure 13:
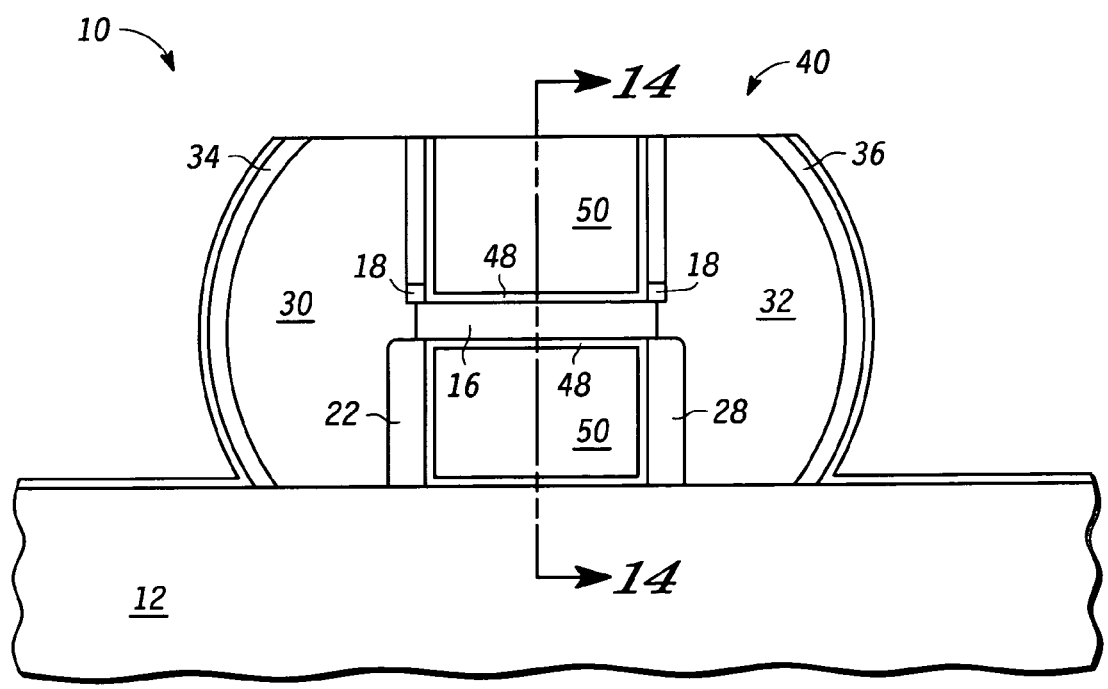
FIG. 13 is a cross section along the first plane of the structure of FIG. 12 at a subsequent stage in processing.

Shown in FIG. 13, continuing with the first cross sectional plane, is semiconductor device 10 after formation of a metal gate 50 over silicon layer 16 and in cavity 46. The deposition initially is preferably by ALD to achieve an effective deposition of metal of a desired work function on insulator. After metal has coated the surface, another, faster method to deposit a metallic conductor is preferably used although ALD could be continued to complete the formation of the gate electrode. Chemical vapor deposition is preferable because it is relatively fast and sufficiently conformal for this purpose. After the deposition has been performed a CMP etch back is performed to remove the metal over source/ drain regions 30 and 32 near where the nitride was removed. After that metal has been removed, a mask is formed over the area where the nitride was removed and the source/drain region near there and also to areas where the gate is to extend outside transistor site 40. With the mask in place, the exposed metal is then removed. This leaves gate metal 50 above and below silicon layer 16 and gate extensions not shown in FIG. 13. Semiconductor device 10 as shown in FIG. 13 is a completed transistor.

Figure 14:
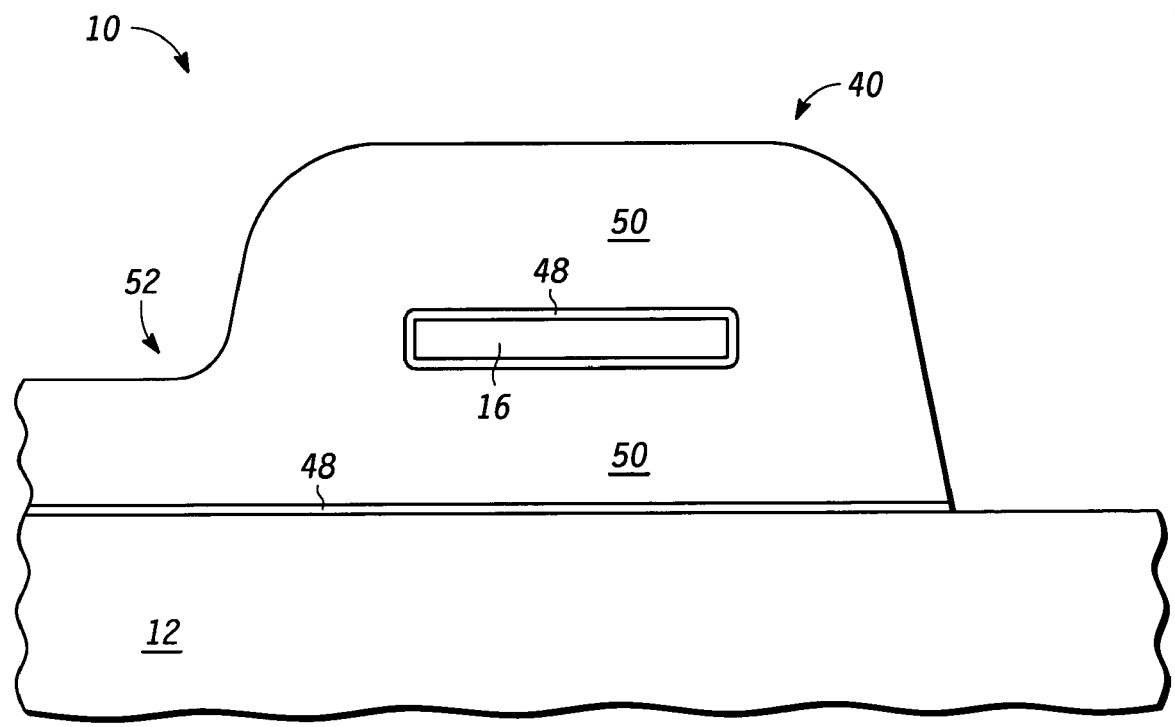
FIG. 14 is a cross section along the second plane of the structure of FIG. 13 at a subsequent stage in processing.

Shown in FIG. 14 is a cross section 14—14, which is a change to the second cross sectional plane, through semiconductor device 10 of FIG. 13 which shows gate metal 50 with a gate extension 52 connected thereto extending outside of transistor 40 for making contact thereto. Specific materials were described as an example but other materials may also be effective. For example, nitride layer 20 may be a different material. It is desirable that it be a layer that is relatively resistant to oxidation. It is undesirable that a layer be formed along the upper transistor location during the formation of layer 21. Silicon layer 16 may be a different monocrystalline semiconductor material. Silicon carbon is a possibility. The important characteristic is that it oxidize significantly more slowly than the layer underneath, for example at least four times slower. SiGe layer 14 may also be another material. The important characteristic is that it etch selective to the overlying monocrystalline semiconductor layer. The relative etch rate is preferably greater than 50 to 1. The preferred metal for metal gate 50 is tantalum nitride but other metals may also be used. Exemplary metals include titanium nitride, tantalum carbide, and nickel silicide. Other materials may also be used. It should have a relatively high reflow temperature and not react with the gate dielectric. Oxide layer 18 may not be required. It is to protect silicon layer 16 during the removal of nitride layer 20. If an etchant that does not disturb silicon is used in the removal of nitride layer 20 or an alternative to nitride layer 20, then silicon layer 16 may not be required. Also another material than oxide may be used. Such material should etch selective to nitride layer 20 or its alternative. The silicon layer may have a thickness of approximately 200 to 700 angstroms. The SiGe layer may have a thickness of approximately 80 to 400 angstroms.

In the foregoing specification, the invention has been described with reference to specific embodiments. However, one of ordinary skill in the art appreciates that various modifications and changes can be made without departing from the scope of the present invention as set forth in the claims below. For example, the gate dielectric was described as a high k dielectric but could be another gate dielectric material such as oxide. Similarly, the gate was described as being a metal but may be some other conductor such as a doped semiconductor. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of making a double-gated transistor, comprising:

forming a patterned pre-transistor stack with stack sidewalls, wherein the pre-transistor stack is disposed on an insulating layer, the pre-transistor stack including a first semiconductor layer overlying the insulating layer, a second semiconductor layer overlying the first semiconductor layer, and an oxidation resistant layer overlying the second semiconductor layer;

forming sidewall insulators on first semiconductor layer sidewall portions and second semiconductor layer sidewall portions of the stack sidewalls, wherein the sidewall insulators of the first semiconductor layer portions comprise a thickness greater than a thickness of the sidewall insulators of the second semiconductor layer portions;

removing the sidewall insulators on the second semiconductor layer portions, wherein removing the sidewall insulators exposes corresponding sidewall portions of the second semiconductor layer;

forming in-situ doped epitaxial source/drain regions, wherein forming the in-situ doped epitaxial source/drain regions includes originating an epitaxial growth of a single crystal semiconductor material at the exposed sidewall portions of the second semiconductor layer;

removing the oxidation resistant layer of the patterned, pre-transistor stack, wherein removing the oxidation resistant layer exposes a first gate location portion of the second semiconductor layer;

forming an insulating liner overlying portions of exposed in-situ doped epitaxial source/drain regions and the exposed first gate location portion of the second semiconductor layer;

removing a portion of the insulating liner overlying the exposed first gate location portion of the second semiconductor layer;

patterning the patterned pre-transistor stack and the in-situ doped epitaxial source/drain regions into a transistor region along a corresponding width dimension of the transistor and exposing the first semiconductor layer at opposite ends of the transistor region;

removing the first semiconductor layer to create an opening, wherein the opening exposes a second gate location portion of the second semiconductor layer;

forming a gate dielectric on the second semiconductor layer, the gate dielectric overlying at least the first and second gate location portions of the second semiconductor layer; and forming a gate electrode on the gate dielectric overlying at least the first and second gate location portions of the second semiconductor layer.

2. The method of claim 1, wherein the first semiconductor layer comprises SiGe, the second semiconductor layer comprises Si, and the oxidation resistant layer comprises at least $Si_3N_4$.

3. The method of claim 1, wherein the first semiconductor layer has an etch selectivity with respect to the second semiconductor layer that is more than 50:1.

4. The method of claim 1, wherein the first semiconductor layer oxidizes at a faster oxidation rate than an oxidation rate of the second semiconductor layer.

5. The method of claim 4, further wherein the oxidation rate of the first semiconductor layer is at least four times faster than the oxidation rate of the second semiconductor layer.

6. The method of claim 1, wherein forming the patterning pre-transistor stack further defines a channel length of a transistor yet to be formed as established by a dimension of the second semiconductor layer.

7. The method of claim 1, wherein removing the sidewall insulators of the second semiconductor layer portion further includes undercutting the second semiconductor layer relative to the first semiconductor layer by over-etching the second semiconductor layer with respect to the first semiconductor layer.

8. The method of claim 1, wherein further the epitaxial growth of the single crystal semiconductor material is maintained for a first time duration sufficient to produce a desired source/drain channel junction and thereafter continues with the same single crystal semiconductor material or an amorphous or polysilicon semiconductor material for a second time duration sufficient to produce a desired source/drain sheet resistance.

9. The method of claim 1, wherein the epitaxial growth is continued for an amount of epi-growth sufficient to overcome a height dimension of the oxidation resistant layer of the pre-transistor stack.

10. The method of claim 1, further comprising subsequent to forming the in-situ doped epitaxial source/drain regions and prior to removing the oxidation resistant layer of the patterned, pre-transistor stack, planarizing the in-situ doped epitaxial source/drain regions down to the oxidation resistant layer of the patterned, pre-transistor stack.

11. The method of claim 1, wherein patterning the patterned pre-transistor stack and the in-situ doped epitaxial source/drain regions further includes patterning the same into one or more transistor regions along a corresponding width dimension of one or more transistors.

12. The method of claim 1, further wherein the second semiconductor layer forms a bridge extending between the in-situ doped epitaxial source/drain regions.

13. The method of claim 1, wherein forming the gate electrode includes depositing a gate electrode material or a stack of gate electrode materials.

14. The method of claim 1, wherein forming the gate electrode includes depositing a gate electrode material or a stack of gate electrode materials using one or more of atomic layer deposition (ALD) or chemical vapor deposition (CVD) processes.

15. The method of claim 1, further comprising forming sidewall spacer on the insulating liner.

16. The method of claim 1, wherein the first semiconductor layer comprises a SiGe layer having a thickness of approximately 200 to 700 angstroms.

17. The method of claim 1, wherein the second semiconductor layer comprises a Si layer having a thickness of approximately 80 to 400 angstroms.

18. The method of claim 1, further comprising:
forming first sidewall spacers that leave the sidewall of the second semiconductor exposed while providing thicker insulation on the sidewalls of the first semiconductor layer; and
forming second sidewall spacers on the insulating liner.

19. A double-gated transistor produced by the method comprising:
forming a patterned pre-transistor stack with stack sidewalls, wherein the pre-transistor stack is disposed on an insulating layer, the pre-transistor stack including a first semiconductor layer overlying the insulating layer, a second semiconductor layer overlying the first semiconductor layer, and an oxidation resistant layer overlying the second semiconductor layer;
forming sidewall insulators on first semiconductor layer sidewall portions and second semiconductor layer sidewall portions of the stack sidewalls, wherein the sidewall insulators of the first semiconductor layer portions comprise a thickness greater than a thickness of the sidewall insulators of the second semiconductor layer portions;
removing the sidewall insulators on the second semiconductor layer portions, wherein removing the sidewall insulators exposes corresponding sidewall portions of the second semiconductor layer;
forming in-situ doped epitaxial source/drain regions, wherein forming the in-situ doped epitaxial source/drain regions includes originating an epitaxial growth of a single crystal semiconductor material at the exposed sidewall portions of the second semiconductor layer;
removing the oxidation resistant layer of the patterned, pre-transistor stack, wherein removing the oxidation resistant layer exposes a first gate location portion of the second semiconductor layer;
forming an insulating liner overlying portions of exposed in-situ doped epitaxial source/drain regions and the exposed first gate location portion of the second semiconductor layer;
removing a portion of the insulating liner overlying the exposed first gate location portion of the second semiconductor layer;
patterning the patterned pre-transistor stack and the in-situ doped epitaxial source/drain regions into a transistor region along a corresponding width dimension of the transistor and exposing the first semiconductor layer at opposite ends of the transistor region;
removing the first semiconductor layer to create an opening, wherein the opening exposes a second gate location portion of the second semiconductor layer;
forming a gate dielectric on the second semiconductor layer, the gate dielectric overlying at least the first and second gate location portions of the second semiconductor layer; and
forming a gate electrode on the gate dielectric overlying at least the first and second gate location portions of the second semiconductor layer.

20. The method of claim 19, further comprising:
forming first sidewall spacers on the stack sidewalls of a height that is substantially the same as the thickness of the first semiconductor layer; and
forming second sidewall spacers on the insulating liner.

* * * * *

UNITED STATES PATENT AND TRADEMARK OFFICE
CERTIFICATE OF CORRECTION

| | | |
|---|---|---|
| PATENT NO. | : 7,202,117 B2 | Page 1 of 1 |
| APPLICATION NO. | : 11/047448 | |
| DATED | : April 10, 2007 | |
| INVENTOR(S) | : Marius K. Orlowski | |

It is certified that error appears in the above-identified patent and that said Letters Patent is hereby corrected as shown below:

In Column 7, Line 59, Claim No. 18:

Change "the second semiconductor exposed while providing" to --the second semiconductor layer exposed while providing--

Signed and Sealed this

Twenty-seventh Day of May, 2008

JON W. DUDAS
*Director of the United States Patent and Trademark Office*